(12) United States Patent
Tsironis

(10) Patent No.: US 8,427,255 B1
(45) Date of Patent: Apr. 23, 2013

(54) SELF ADJUSTABLE PROBES FOR SLIDE SCREW IMPEDANCE TUNERS

(76) Inventor: Christos Tsironis, Kirkland (CA)

( * ) Notice: Subject to any disclaimer, the term of this patent is extended or adjusted under 35 U.S.C. 154(b) by 22 days.

(21) Appl. No.: 13/238,050

(22) Filed: Sep. 21, 2011

(51) Int. Cl.
*H03H 7/38* (2006.01)
(52) U.S. Cl.
USPC .......................................... 333/17.3; 333/263
(58) Field of Classification Search ................. 333/17.3, 333/263, 32
See application file for complete search history.

(56) References Cited

U.S. PATENT DOCUMENTS

| | | |
|---|---|---|
| 6,674,293 B1 | 1/2004 | Tsironis |
| 6,850,076 B2 | 2/2005 | Tsironis |
| 6,980,064 B1 | 12/2005 | Boulerne |
| 7,053,628 B1 | 5/2006 | Tsironis |

OTHER PUBLICATIONS

Prematching Tuners for Very High VSWR and Power Load Pull Measurements, Product Note 52, Focus Microwaves, Mar. 1999.
"Three Probe Tuners Tackles Multiple Tasks", Microwaves & RF Magazine, Feb. 2005, p. 90.

*Primary Examiner* — Stephen Jones

(57) ABSTRACT

An automatic slide screw impedance tuner uses one or more adjustable RF probes, either independently movable or linked together, in order to generate high VSWR; precise alignment of two RF probes inside the same slabline is critical, since they must glide seamlessly inside the slabline slot, very closely to the center conductor over large horizontal displacements; a self-aligning link between the tuner axis and the probes is made using a flexible steel blade and allows one or both of them to be mounted on the tuner's vertical axis in a manner that allows lateral and tilting self-alignment of the probe with hysteresis-free movement in vertical and horizontal directions, as required for exact re-positioning of the probe in the slabline during measurement. In case of multiple probes mounted on the same tuner axis the steel blade link provides also for variable spacing for optimum frequency operation of the tuner.

5 Claims, 22 Drawing Sheets a) b)

View of RF probe mounted inside a slabline using a vertical flexible steel blade. a) Cross section, b) side cross view

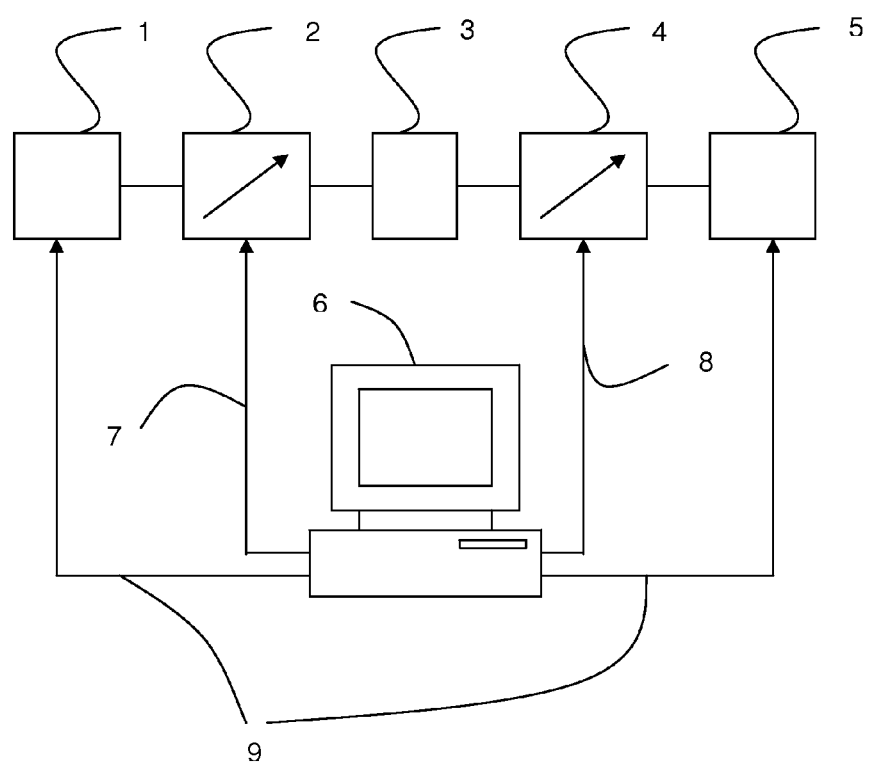
FIGURE 1: Prior art, typical automated load pull test setup

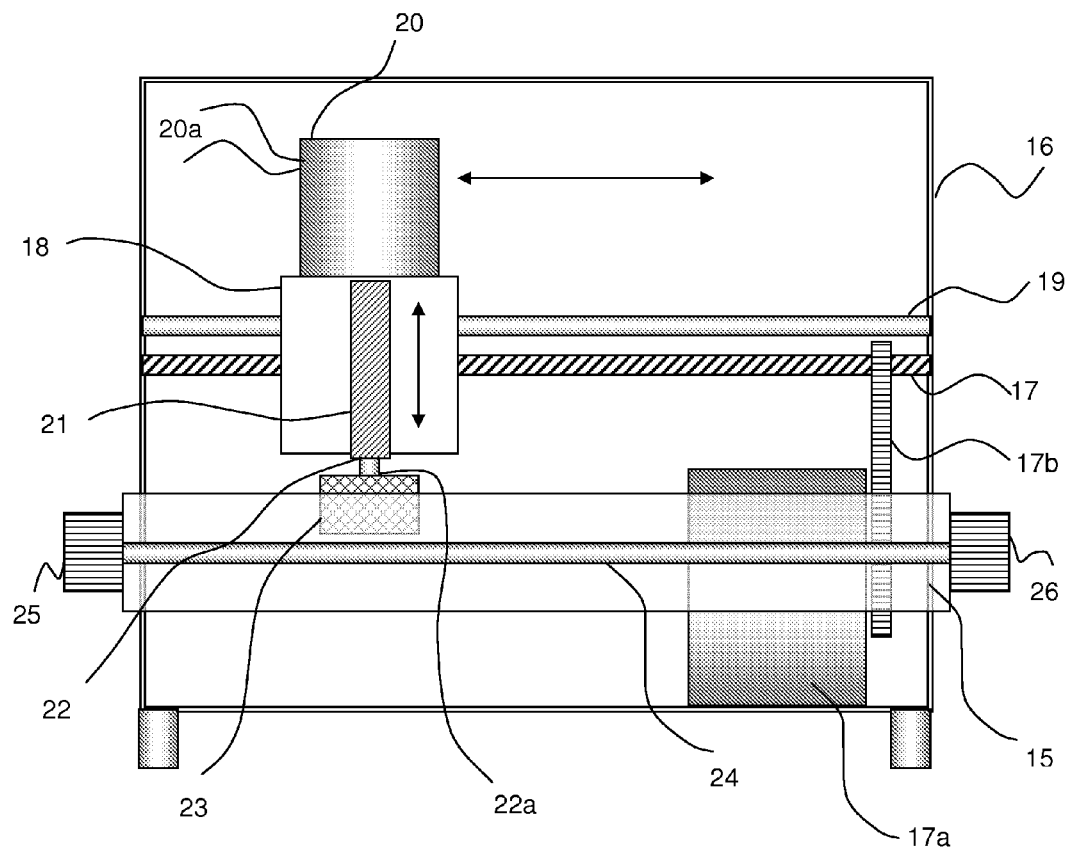
FIGURE 2: Prior art, cross section of slide screw tuner with a single vertical axis and probe

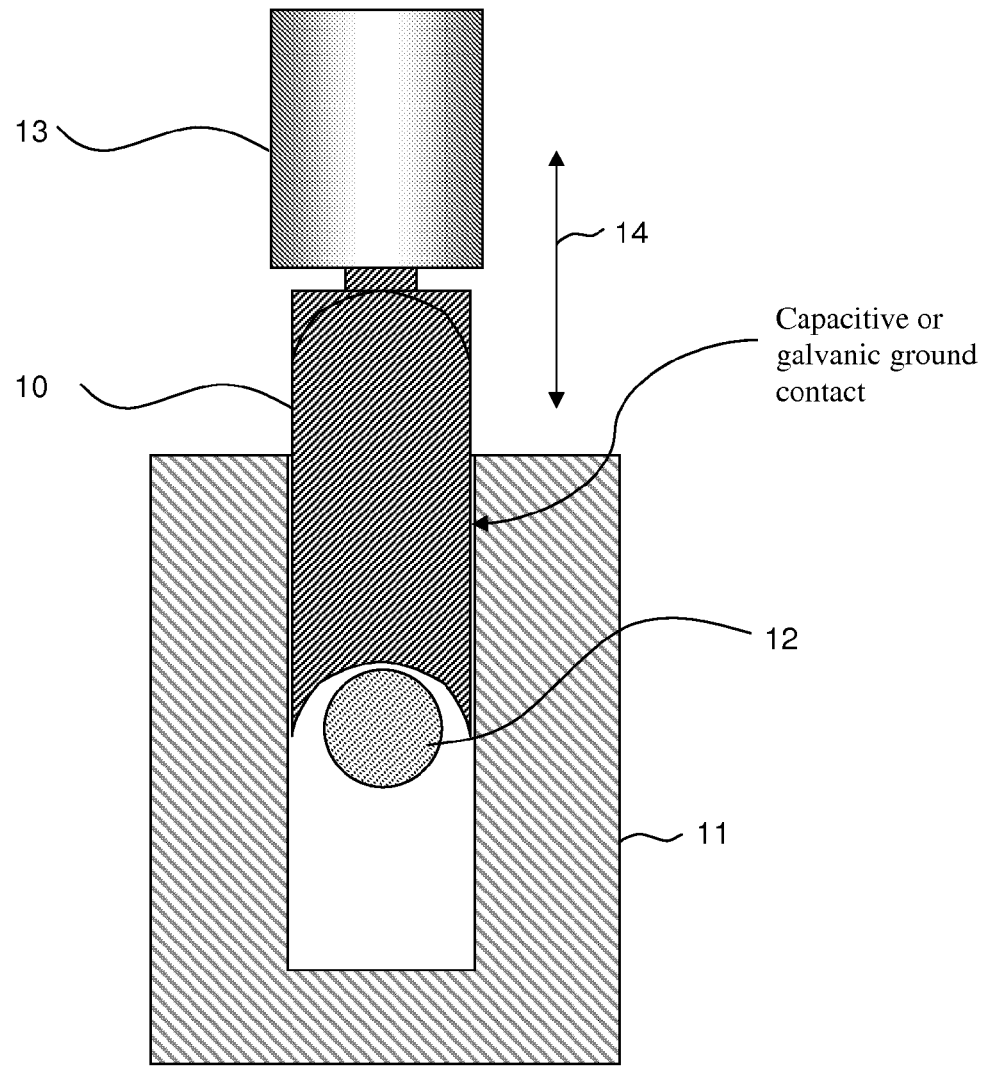
FIGURE 3: Prior art, cross section of perfectly aligned slide screw tuner

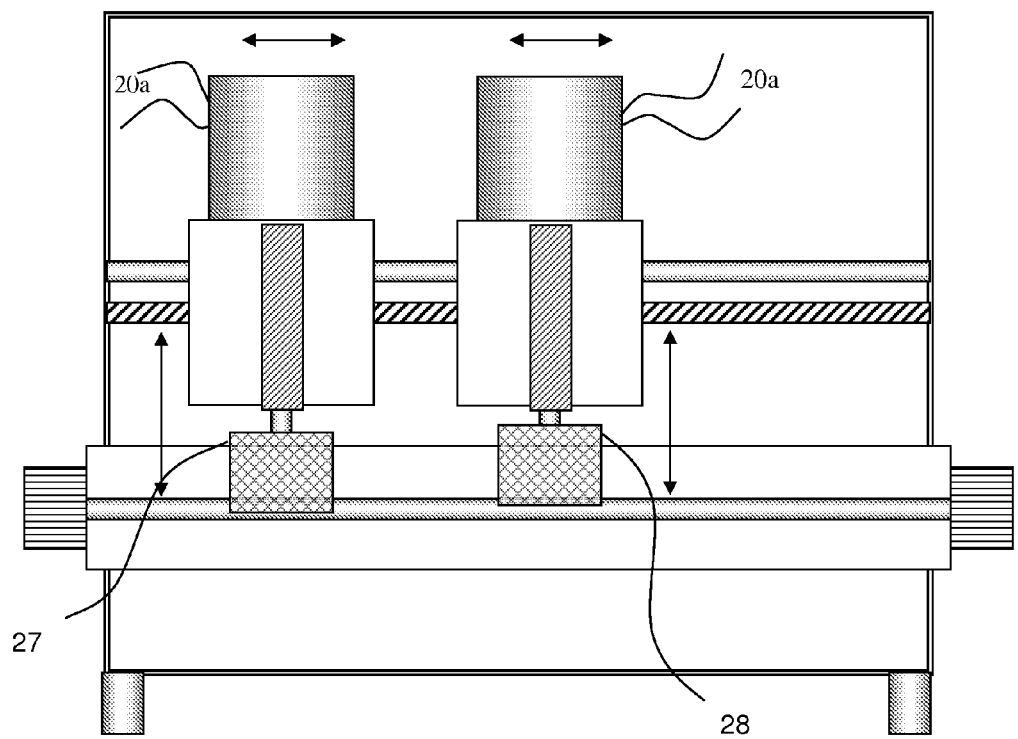
FIGURE 4: Prior art, cross section of slide screw tuner with two independent probes and vertical axis

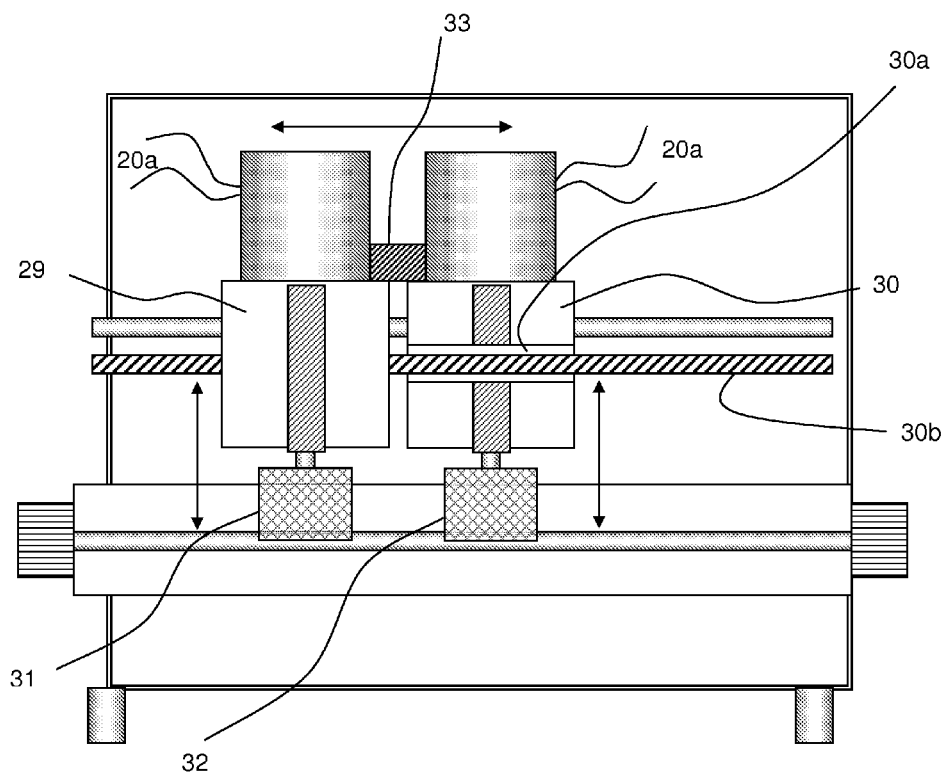
FIGURE 5: Prior art, cross section of slide screw tuner with two linked and synchronous vertical axis and probes

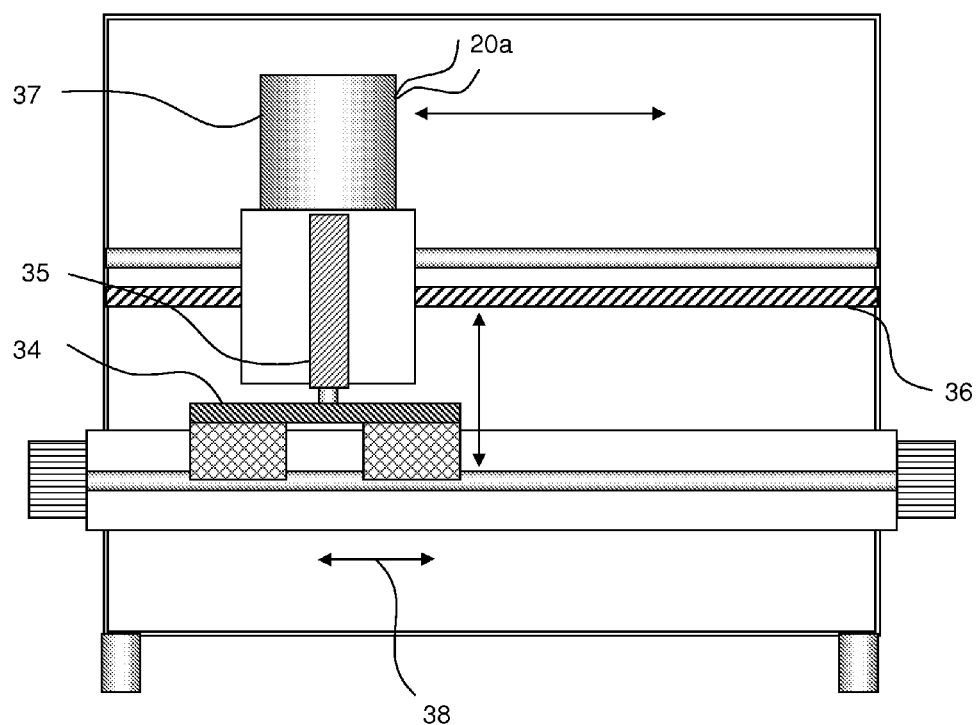
FIGURE 6: Prior art, cross section of slide screw tuner with a single vertical axis and double probe

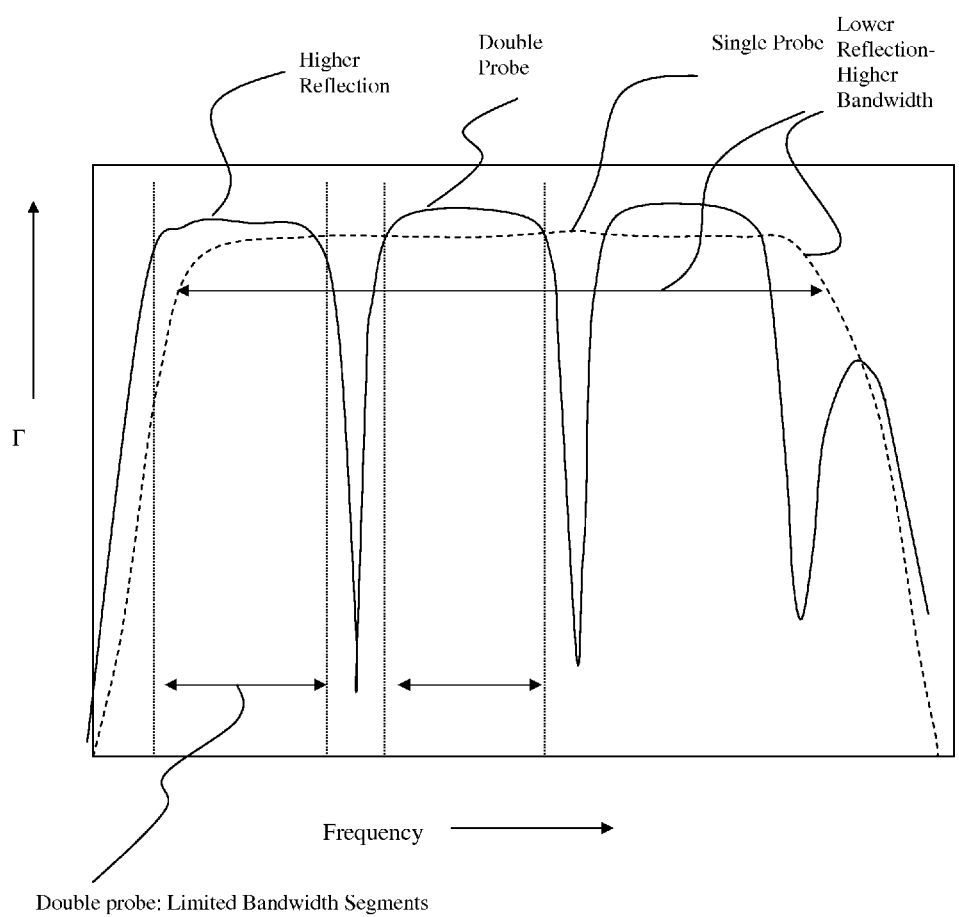
FIGURE 7: Prior art, frequency response of single probe and ideally aligned double probe tuners

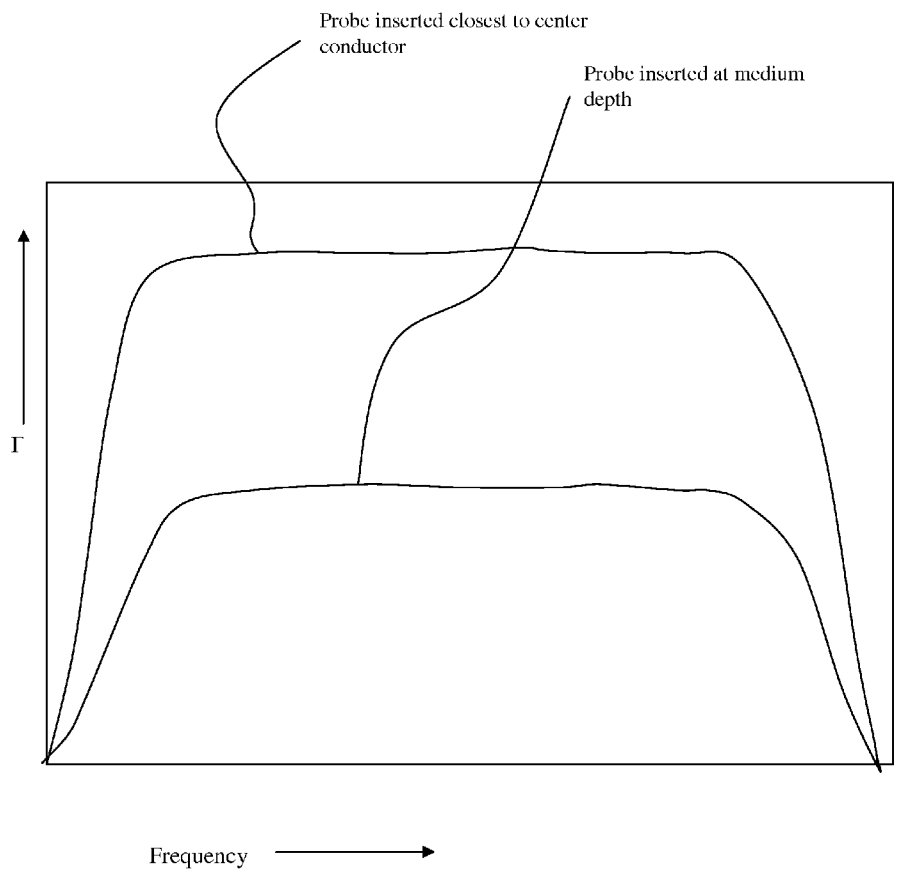
FIGURE 8: Prior art, frequency response of load pull tuner using optimally aligned single probe

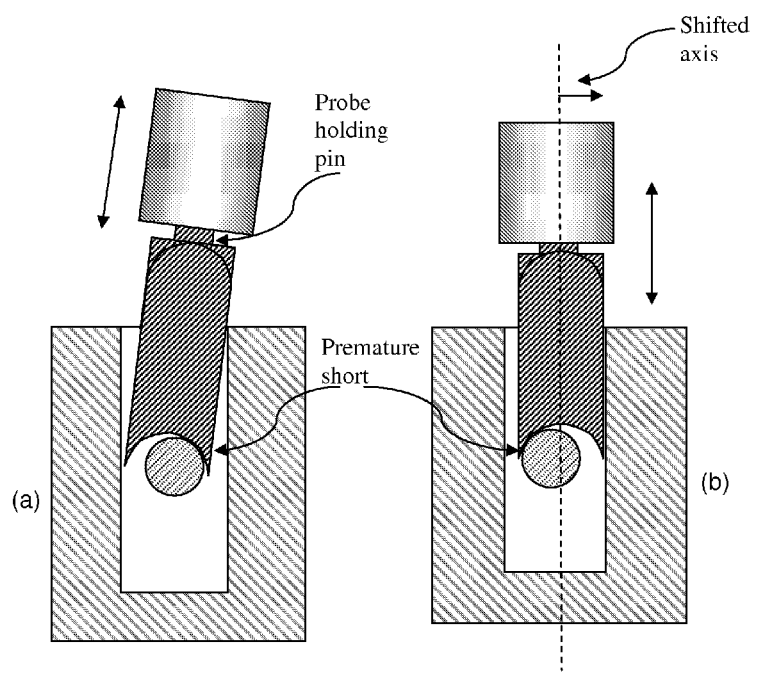
FIGURE 9: Prior art: Possible misalignment of RF probes in slide screw tuners: a) Tilted tuner axis or probe holding pin; b) Shifted tuner axis

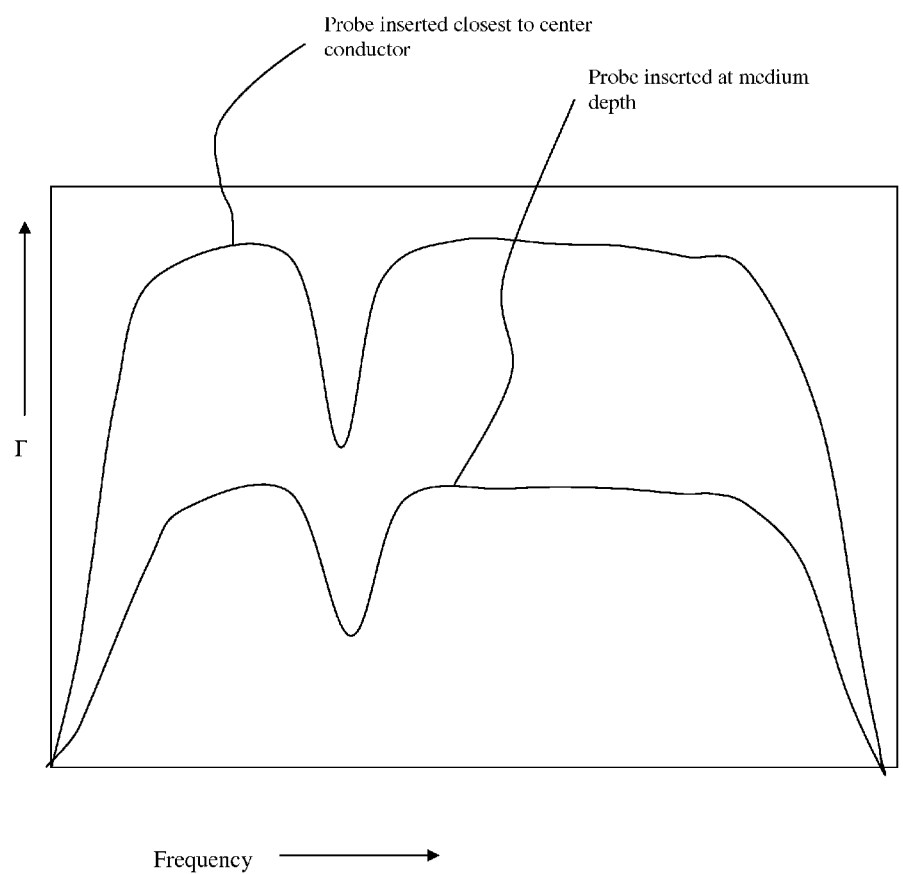
FIGURE 10: Prior art: typical frequency response of misaligned tuner probe

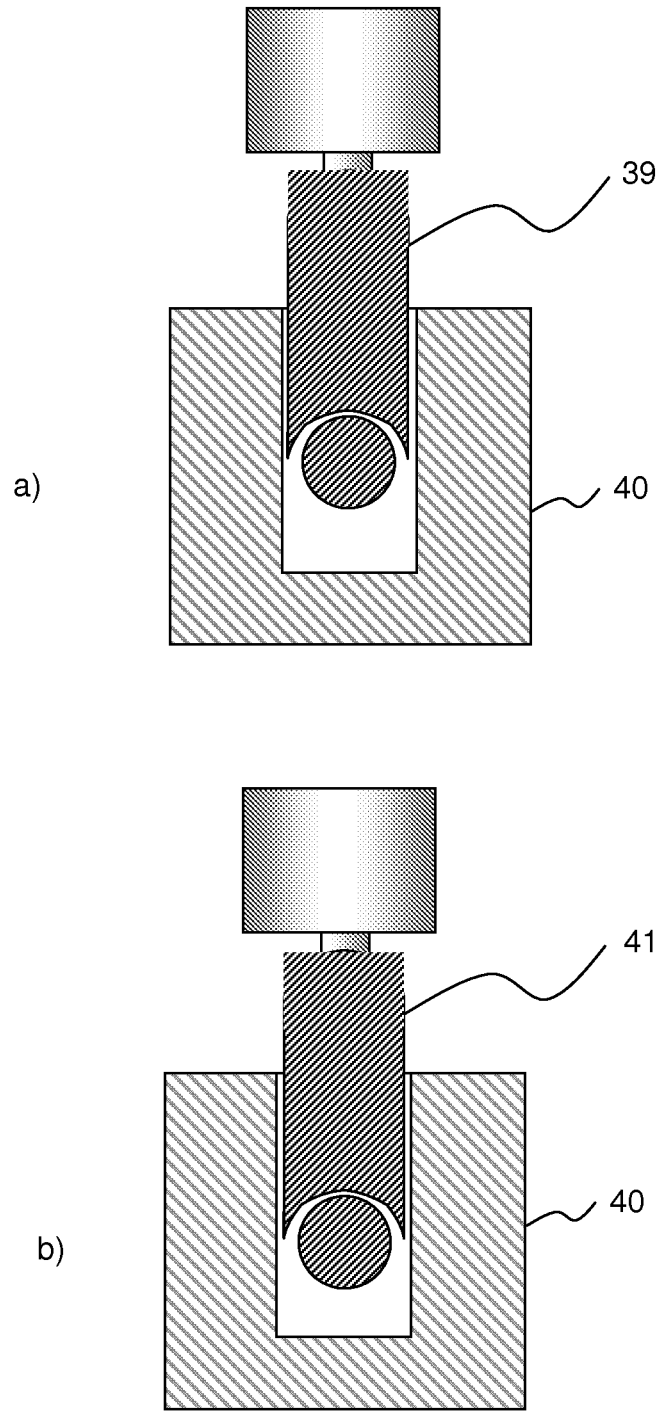
FIGURE 11: Ideally aligned probes in a slide screw tuner with two (or more) independent or linked together probes.

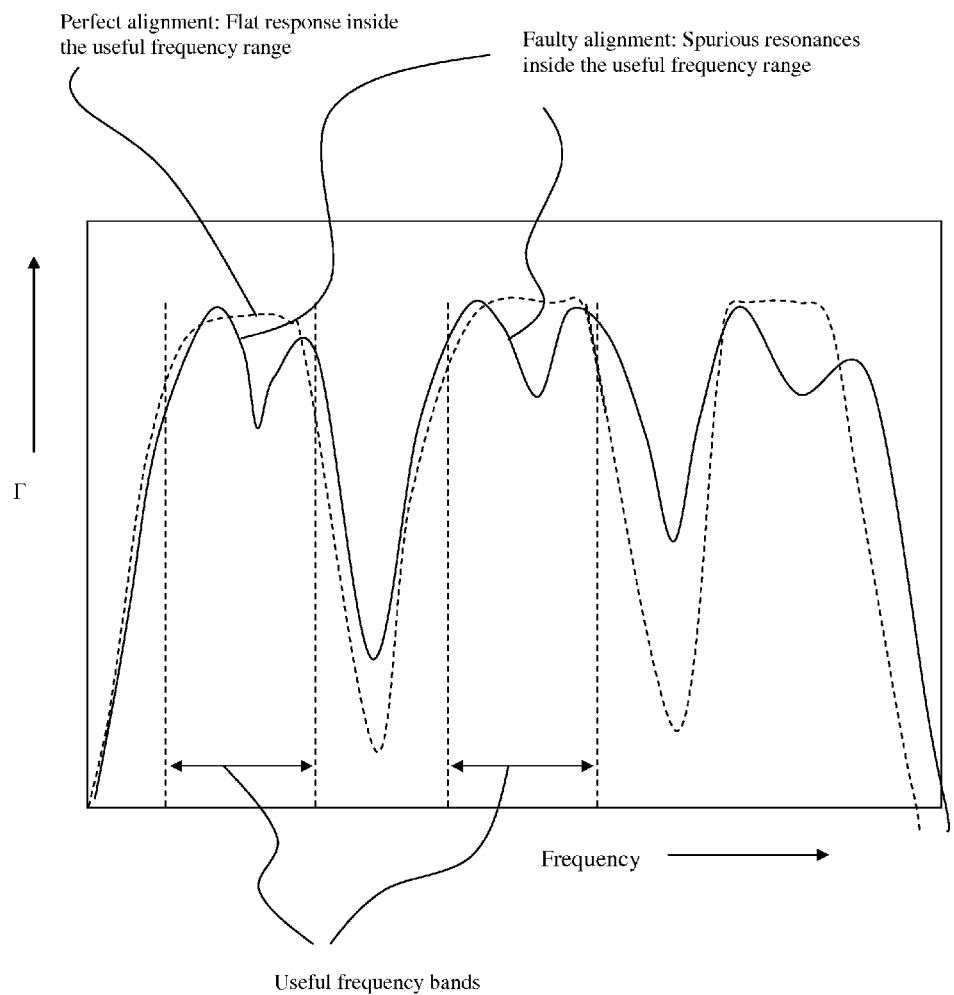
FIGURE 12: Prior art, typical frequency response of perfectly aligned versus misaligned two probe tuner

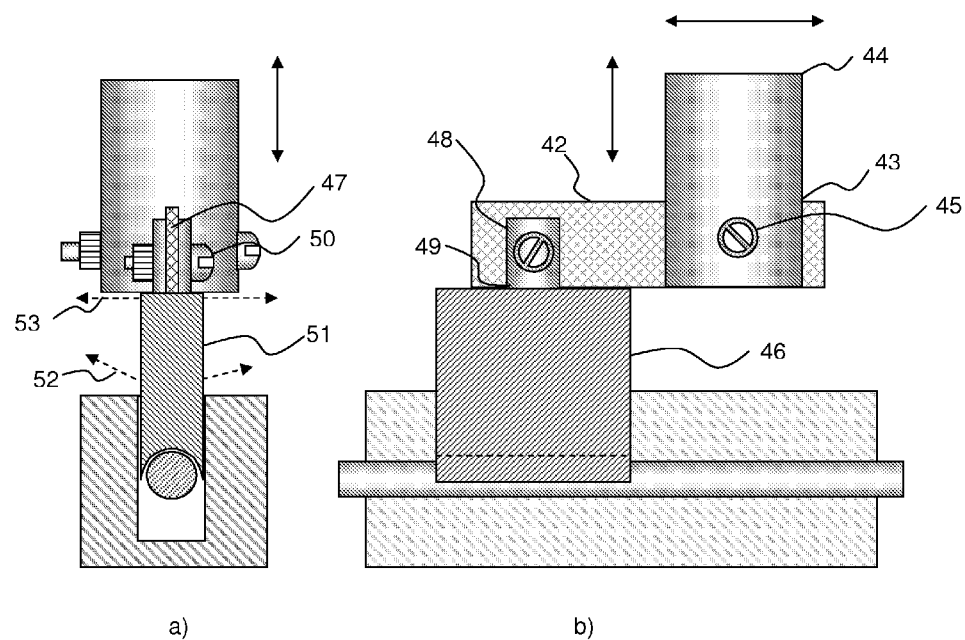
FIGURE 13: View of RF probe mounted inside a slabline using a vertical flexible steel blade. a) Cross section, b) side cross view

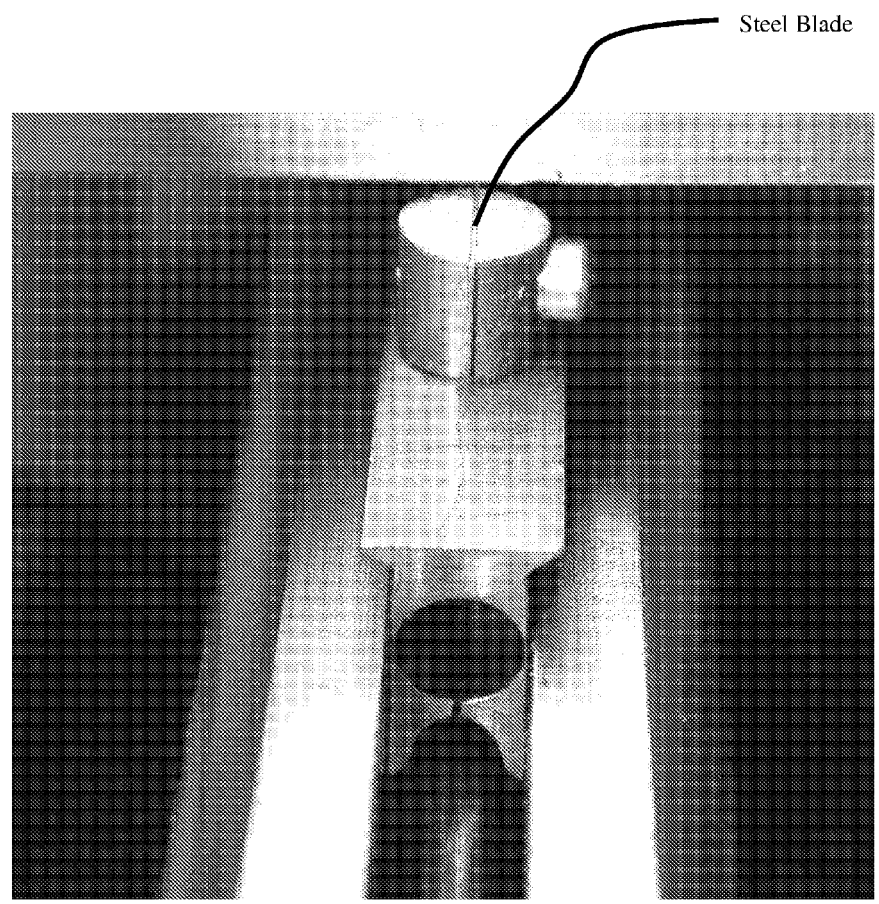
FIGURE 14: Actual view of self aligning RF probe mounted inside a slabline using a flexible steel blade

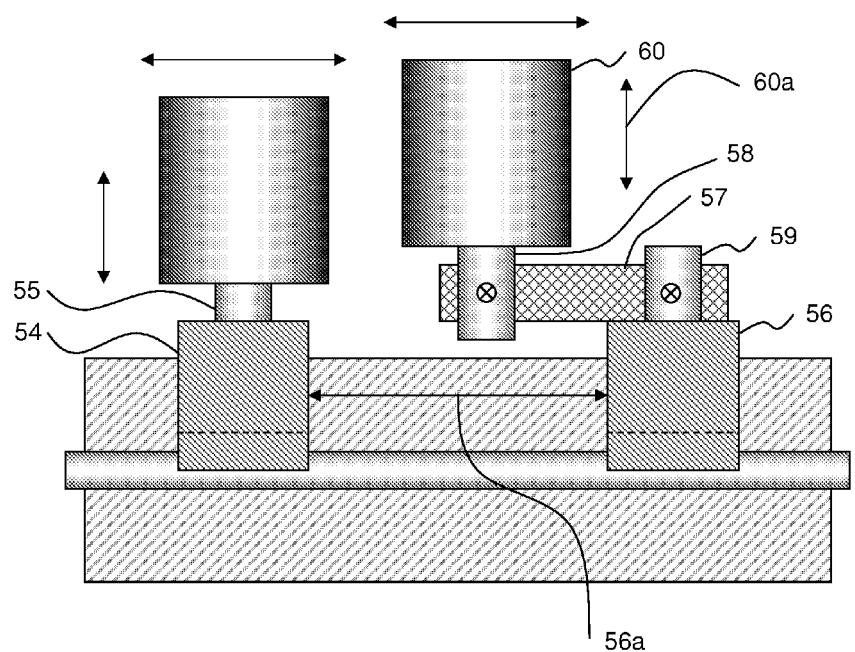
FIGURE 15: Side view section of two probe tuners, one with fixed mounting and one with flexible mounting

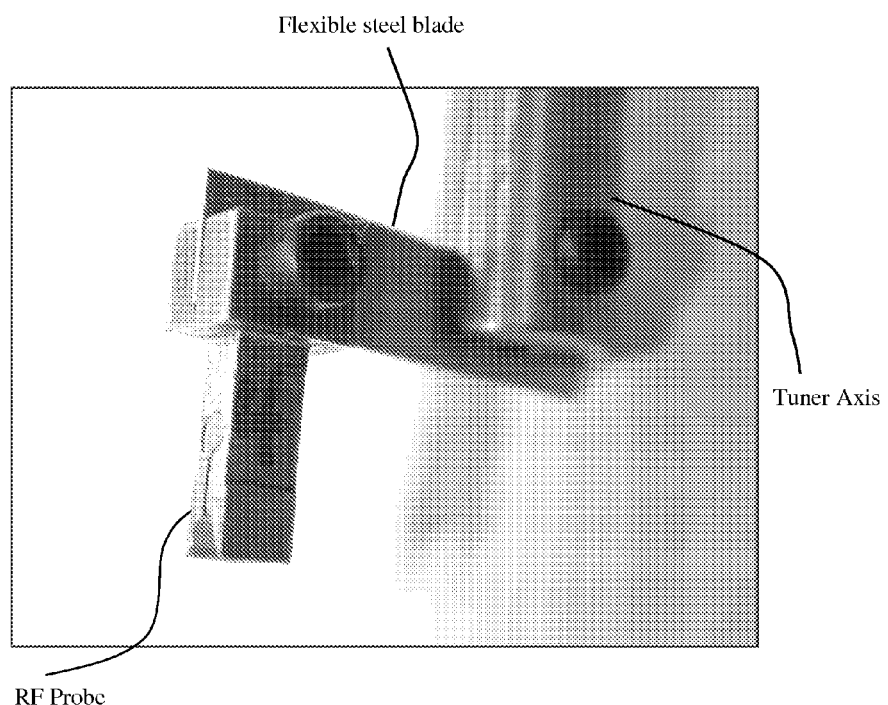
FIGURE 16: Actual prospective picture of flexible probe mounting on tuner axis

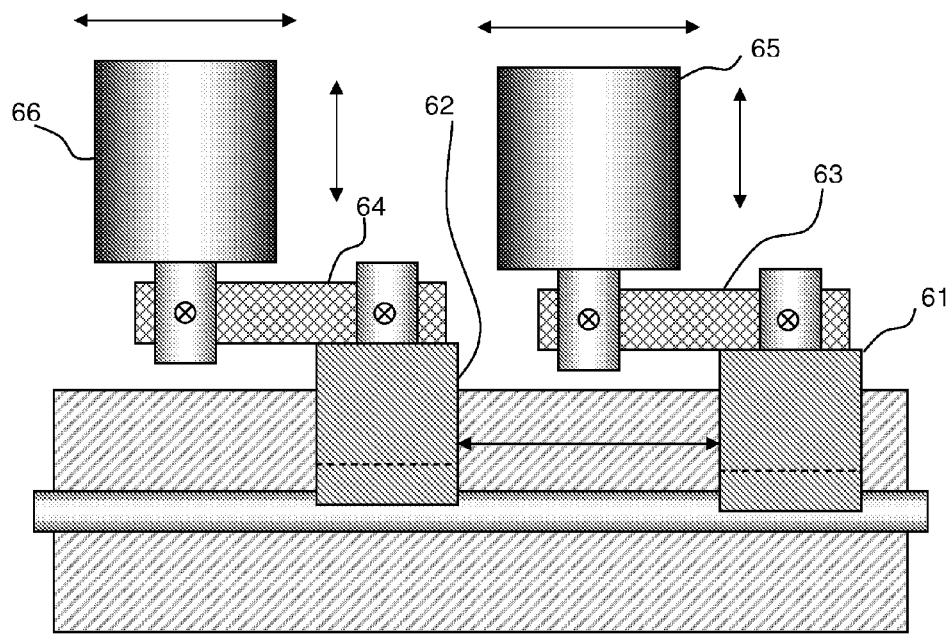
FIGURE 17: Side view section of two probe tuner, where both probes are mounted using flexible steel blade joints

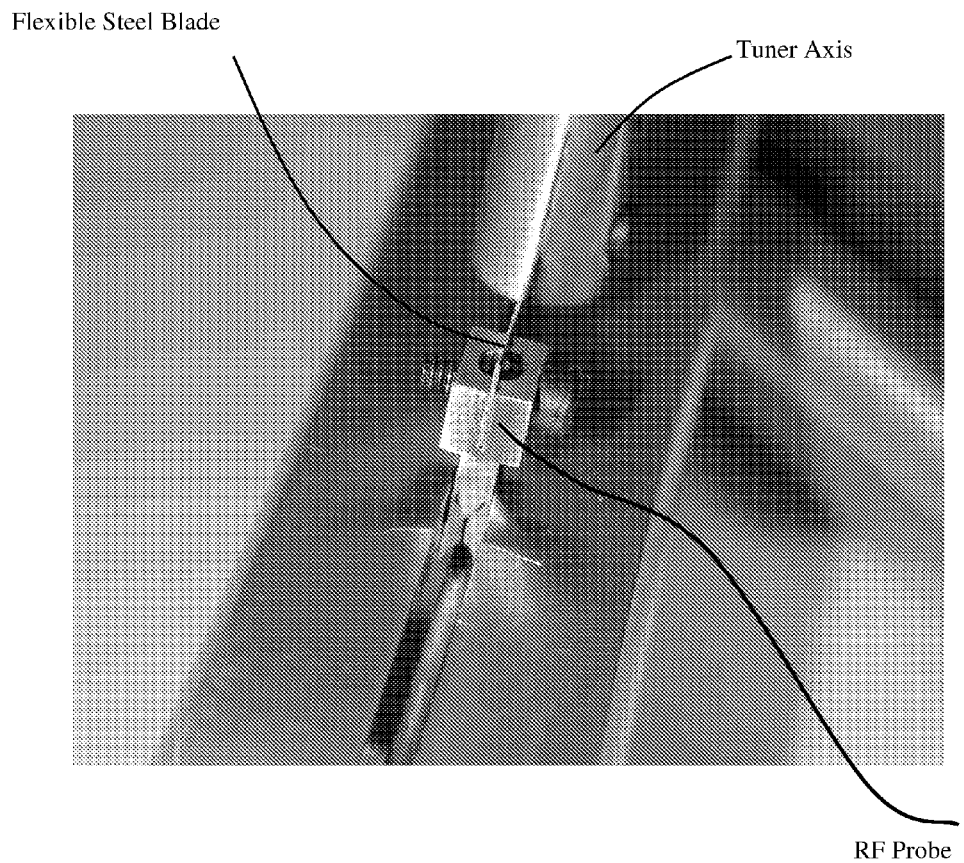
FIGURE 18: Actual picture of RF probe mounted in a slide screw tuner slabline and held with flexible steel blade joint

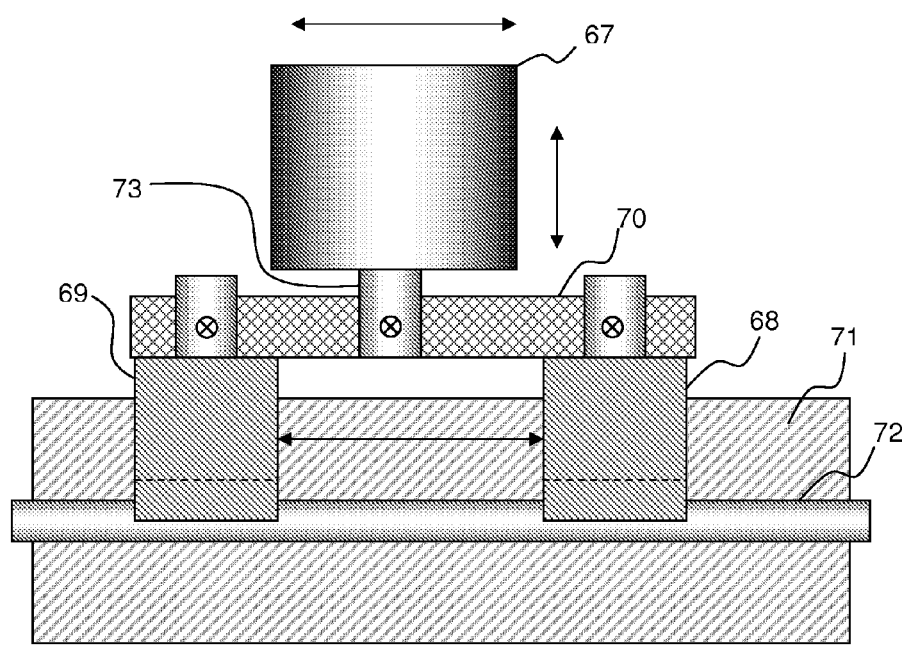
FIGURE 19: Flexible self aligning assembly of double probe tuner

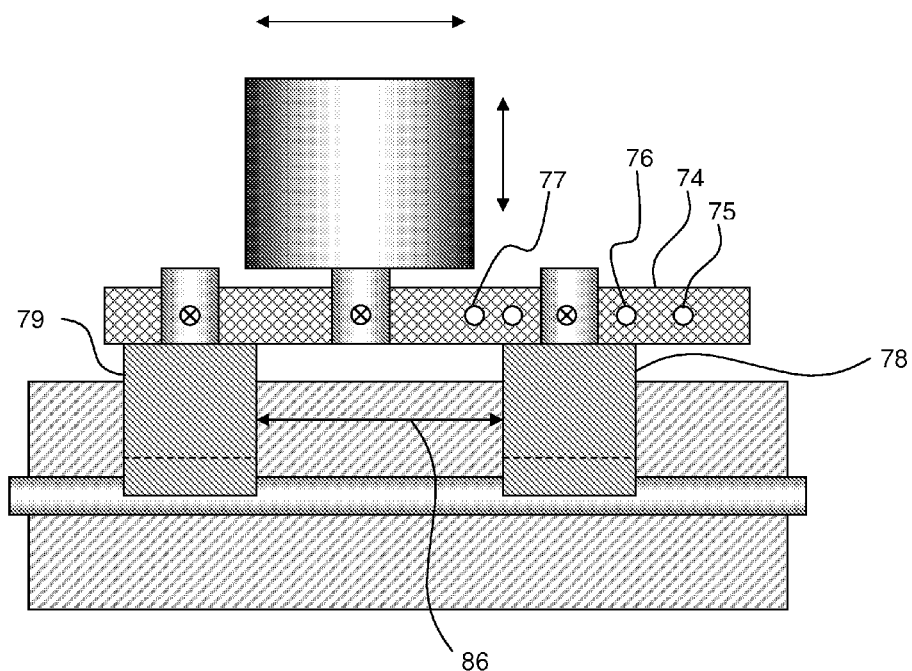
FIGURE 20: Flexible, self aligning assembly with frequency band switching capability

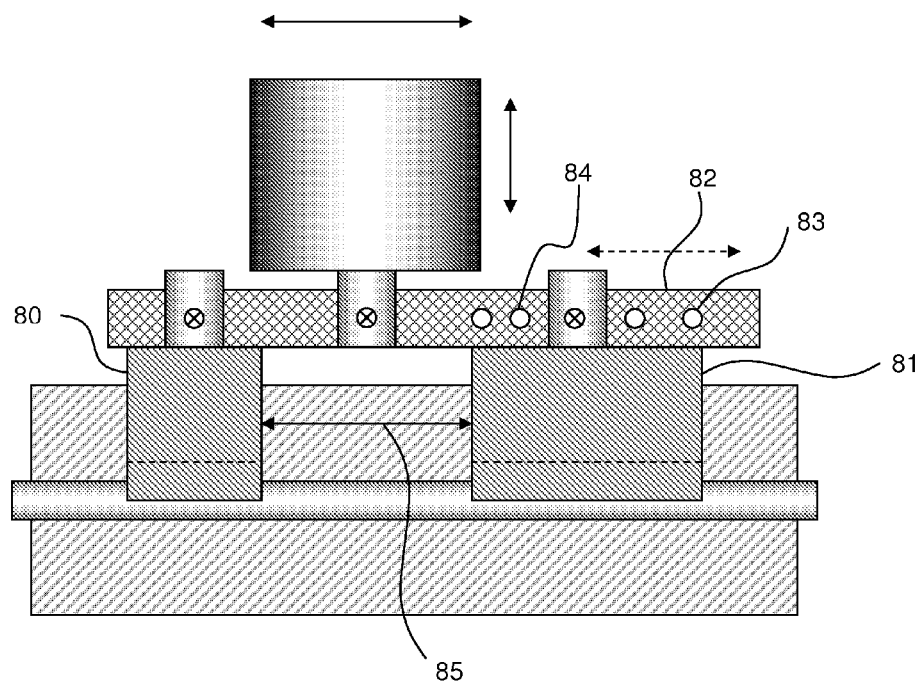
FIGURE 21: Flexible, self aligning assembly with a low and a high frequency probe and frequency band switching capability

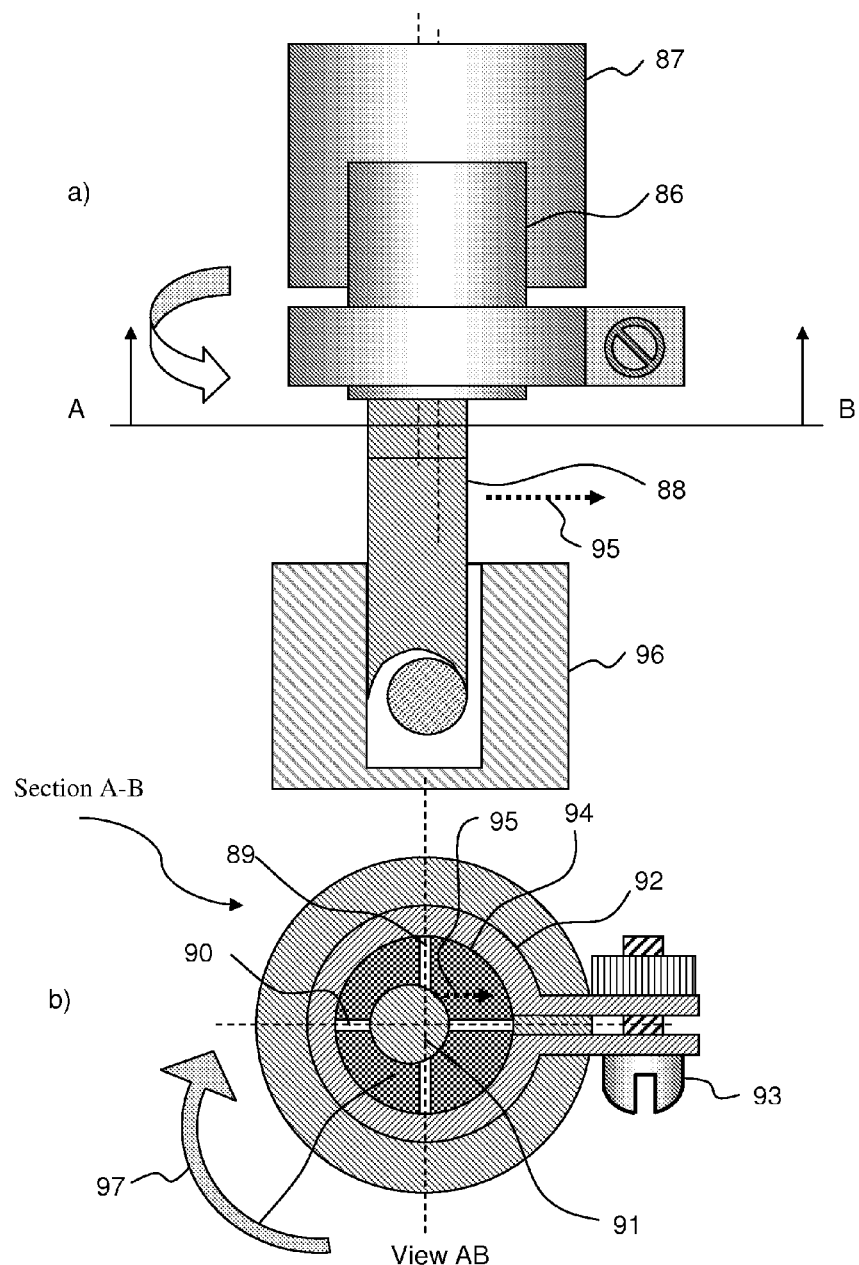
FIGURE 22: Probe holder with intermediate mounting ring, allowing lateral adjustment of the probe

SELF ADJUSTABLE PROBES FOR SLIDE SCREW IMPEDANCE TUNERS

PRIORITY CLAIM

Not Applicable

CROSS-REFERENCE TO RELATED ARTICLES

[1] U.S. Pat. No. 6,674,293: Adaptable pre-matched tuner system and method.
[2] U.S. Pat. No. 6,850,076: Microwave tuners for wideband high reflection applications.
[3] U.S. Pat. No. 6,980,064: Slide-screw tuner with single corrugated slug.
[4] U.S. Pat. No. 7,053,628: High reflection microwave tuner using metal-dielectric probe and method.
[5] Product Note 52, "Prematching tuners for very high VSWR and power load pull measurements"; Focus Microwaves, March 1999.
[6] "Three probe tuners tackles multiple tasks", Microwaves & RF Magazine, February 2005, page 90.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of microwave power transistors using automatic microwave tuners for synthesizing reflection factors (impedances) and match the transistors (device under test, DUT) at the input and output at the fundamental and harmonic frequencies.

Modern design of high power microwave amplifiers, oscillators and other active components used in various communication systems requires accurate knowledge of the active device's (microwave transistor's) characteristics. In such circuits, it is insufficient and inaccurate for the transistors operating at high power in their highly non-linear regions and close to saturation, to be described using analytical or numerical models only. Instead the devices must be characterized using specialized test setups under the actual operating conditions.

A popular method for testing and characterizing transistors for high power operation is "load pull" and "source pull". A typical load pull setup is shown in FIG. 1. Load pull or source pull are measurement techniques employing microwave tuners 2, 4 and other microwave test equipment, like a signal source 1, an RF (Radio Frequency) load 5, control computer 6 and digital connections 7, 8, 9 between the computer and the tuners and test equipment. The microwave tuners 2, 4 in particular are used in order to manipulate the RF impedance conditions under which the DUT, 3, is tested.

Electro-mechanical tuners [1] are used in most cases for high power load pull testing, because they have several advantages, such as long-term stability, higher handling of RF power, easier operation and lower cost, compared to other type of tuners such as electronic and active tuners.

FIG. 2 shows a front view and cross section of an automatic electro-mechanical tuner using the "slide-screw" tuning concept; a slotted airline (slabline) 15, with two RF connectors 25, 26 at both ends is embedded in a solid housing 16, which also comprises a mobile carriage 18 and means for horizontal drive, typically a lead screw 17, driven by a stepper motor 17a and gear 17b; said carriage slides smoothly on polished and grounded shafts 19. The carriage 18 comprises a stepper motor 20, which is powered 20a by a control computer running appropriate software and controls the movement of a precise vertical axis 21. At the bottom end of the axis 22 an appropriate clamp 22a holds the holding pin of the RF probe 23 and secures its exact and repeatable positioning very close to the center conductor 24 of the slabline 15. Moving the probe 23 closer to the center conductor 24 increases the amplitude of the reflection factor, and moving it along the axis of the slabline 15 controls its phase.

A cross section of the 'slide screw' tuning mechanism is shown in FIG. 3; in this configuration adjustable metallic obstacles (probes or "slugs") 10 are inserted into the transmission media of the tuners, which is a slotted coaxial or parallel plate airline (slabline) 11; the capacitive coupling between the vertical probe 10 and the central conductor 12 of the slotted airline (slabline) creates a wideband RF reflection factor (F), of which the amplitude can be adjusted by inserting the probe 10 further into the slabline and modifying the gap between the probe 10 and the central conductor 12 and therefore changing the value of the capacitance between the central conductor 12 and the probe 10.

The probe 10 is held and guided by the vertical axis 13 of the tuner and is moved vertically 14 by the axis 13, which is driven by a vertical lead screw and computer controlled stepper motors, known in prior art [4, FIG. 3] and here in FIGS. 2, 3.

High power RF transistors (DUT), for which, due to lack of adequate nonlinear numeric models, load pull testing is a very important characterization method, have very low internal RF impedance $R_{min}$ of the order of 1 to 2Ω and sometimes below; the tuners used for load pull testing need to physically match the internal impedance of the transistors, meaning that they must be able to generate such low impedances in a measurement system with typically 50Ω characteristic impedance. This means in many cases the tuners must be able to generate RF reflection factors (F) between 0.92 and 0.98 or a Voltage Standing Wave Ratio (VSWR) between 24:1 and 99:1;

The following simple relations are used:

$$VSWR = \frac{1+\Gamma}{1-\Gamma} \qquad \text{eq. 1}$$

$$R\min = \frac{50\Omega}{VSWR} \qquad \text{eq. 2}$$

A reflection factor of $\Gamma=1.0$ corresponds to a VSWR=∞ or a short circuit, $R_{min}=0\Omega$ and no power at all is transferred from the DUT to the load. Ordinary single probe tuners can generate typical VSWR values of the order of 20:1 or less ($\Gamma=0.905$ or smaller).

DESCRIPTION OF PRIOR ART

Tuners generating VSWR high enough (typically VSWR>100:1) to match very low impedance transistors, often use the "independent two-probe" or "pre-matching" concept [1] (FIG. 4). In these tuners the first probe 27 tunes in the general area of the DUT conjugate complex impedance and the second probe 28 tunes around it to determine the optimum matching conditions. Such tuners can create VSWR up to 200:1 depending on the frequency range and internal loss of components (slablines, adapters) used [5];

Another method used in tuners in order to generate high VSWR employs the "electro-mechanically linked two-probe" concept [2] (FIG. 5). In this case there is a master carriage 29, which is driven by the lead screw 30b and a slave carriage 30, which is not attached, 30a, and not driven by the lead screw 30b; both carriages holding the two probes 31 and 32 are linked together mechanically 33, in a manner allowing their horizontal distance to be adjusted manually and fixed for the entire test session, and they are driven electrically to move vertically in unison; therefore those tuners allow the two probes to move both horizontally and vertically synchronously. This creates a form of wideband resonance with high VSWR and tuning patterns different than the "two independent probe (pre-matching)" configuration [1]; tuners with two linked probes cover the whole Smith Chart homogenously [2]. These tuners are cheaper to manufacture than the twin independent probe tuners in what they require only a single horizontal motor and drive.

A third possibility is to use a further simplified version of the "electro-mechanically two-linked-probes" concept by using a single carriage and double probes, i.e. two (or more) probes 34 mounted on the same vertical axis 35 [3] (FIG. 6). This configuration uses only one horizontal 36 and one vertical 37 drive mechanism and is therefore even cheaper to manufacture (FIG. 4); however the fact that the horizontal distance 38 between probes cannot be changed limits the utility of the tuner to a certain frequency range, since linked slugs create fixed multiple reflection frequency response (FIG. 7).

A common problem with extracting superior performance from slide screw tuners is the accurate positioning of the probes inside the slotted airline (slabline). If a probe is positioned exactly as shown in FIG. 3 across the whole length of the slabline, then the required performance as shown in FIG. 8 is achieved.

In the case of a single probe, precise alignment is possible, though tedious, by slightly moving and rotating the slabline in its anchors compared with the vertical axis of the tuner holding the probe. This makes it possible to accurately adjust the mutual positioning between one probe and the slabline. However, even in the case of a single probe, manufacturing tolerances in straightness of the slabline channel often cause difficulties in aligning a tuner over its full length.

When two (or more) probes are used inside the same slabline (FIGS. 4, 5, 6), alignment becomes much more difficult. The difficulty comes from manufacturing and assembly tolerances in the order of a few thousands of an inch. For this reason a typically used, rigid attachment between vertical tuner axis and probe needs improvement.

Probe misalignment can be either by tilted vertical axis (FIG. 9a) or lateral shifting of either the axis or the slabline (FIG. 9b); in both cases the ideal frequency response of a single probe (FIG. 8) is distorted by spurious resonance-type responses as shown in FIG. 10; a tuner with a frequency response as in FIG. 10 is useless. This phenomenon is typical in misaligned tuners and must be eliminated.

The objective is to obtain two (or more) probes 39, 41 inside the same slabline 40 perfectly aligned as shown in FIG. 11a, b. In this case the response of a two probe tuner will be as shown in FIG. 7, whereas, if one or both probes is misaligned, as shown in FIG. 9, then the frequency response of the tuner will be flawed as shown in FIG. 12.

This invention describes a link between probe(s) and tuner axis, which allows precise positioning where it matters, that is minimum vertical and horizontal movement play, but allows sidewise movement and tilting of the probe(s), in order to be able to compensate for manufacturing tolerances in slabline straightness and vertical axis positioning and tilting.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a typical automated load pull test setup.

FIG. 2 depicts prior art, a front view and cross section of a slide screw tuner with a single vertical axis and probe.

FIG. 3 depicts prior art, a cross section of a perfectly aligned slide screw tuner.

FIG. 4 depicts prior art, a front view and cross section of a slide screw tuner with two independent probes and vertical axis.

FIG. 5 depicts prior art, a front view and cross section of a slide screw tuner with two linked and synchronous vertical axis and probes.

FIG. 6 depicts prior art, a front view and cross section of a slide screw tuner with a single vertical axis and double probe.

FIG. 7 depicts prior art, the frequency response of single probe and ideally aligned double probe tuners.

FIG. 8 depicts prior art, the frequency response of a load pull tuner using optimally aligned single probe.

FIG. 9 depicts prior art, possible causes of misalignment of RF probes in slide screw tuners: a) tilted tuner axis or probe holding pin; b) shifted tuner axis.

FIG. 10 depicts prior art, the typical frequency response of a misaligned tuner probe.

FIG. 11 depicts ideally aligned probes in a slide screw tuner using two independent or linked probes.

FIG. 12 depicts prior art, typical frequency response of perfectly aligned versus misaligned two probe tuner.

FIG. 13 depicts a view of a RF probe mounted inside a slabline using a vertical flexible steel blade.

FIG. 14 depicts an actual view of a self-aligning RF probe mounted inside a slabline using a flexible steel blade.

FIG. 15 depicts a side view section of a two-probe tuner, one probe with fixed mounting and one probe with flexible mounting.

FIG. 16 depicts an actual prospective picture of flexible probe joint and mounting on the tuner axis.

FIG. 17 depicts a side view section of a two-probe tuner, where both probes are mounted using flexible steel blade joints.

FIG. 18 depicts an actual picture of an RF probe mounted in a slide screw tuner slabline and hold with flexible steel blade.

FIG. 19 depicts a flexible self-aligning assembly of a two-probe tuner.

FIG. 20 depicts a flexible, self-aligning assembly for double probe slide screw tuners with frequency band switching capability.

FIG. 21 depicts a flexible, self-aligning assembly for double probe slide screw tuners with a low and a high frequency probe and frequency band switching capability.

FIG. 22 depicts a probe holder with intermediate mounting ring, allowing lateral adjustment of the probe.

DETAILED DESCRIPTION OF THE INVENTION

Both, in single probe and in multiple probe slide screw tuners, probe (slug) alignment remains a major issue. In particular when "contacting" probes are used, i.e. probes which touch the lateral walls of the slabline in order to establish firm and continuous RF ground contact. In these cases minor misalignments due to unavoidable manufacturing tolerances will lead to spurious resonances in the tuner response (FIG. 10). This behavior renders the tuner useless and must be avoided at all costs.

The challenge is to make a flexible joint between the rigid vertical tuner axis and the probe, which will allow the probe to do two things at once: a) Follow the shape of the slabline and align itself inside the slabline and b) compensate for shifting or tilting of the tuner axis; at the same time, however, the probe shall not have any slack or backlash in either critical direction, i.e. when the probe is inserted in or lifted out of the slabline, or when it is pushed along the axis of the slabline. The probe must move up and down inside the slabline without backlash (not losing "steps") and without losing the exact vertical position, which may happen if the probe tilts vertically.

The same challenges are for horizontal movement: the probe must move back and forth and regain the exact horizontal position, within micrometers; this means the link to be used shall not allow any tilting of the probe when moving horizontally.

At the same time the probe must be able to tilt sideways in order to compensate for axis misalignment (FIG. 9a) and be able to turn slightly and compensate for slabline mis-orientation, non-perfect slabline straightness and vertical axis shifting (FIG. 9b).

A probe holder in form of a thin steel blade (FIGS. 13, 14, 16) performs this task. Typical thickness of the steel blade 42 range between 0.010" and 0.020". The steel blade 42 is inserted in a vertical slot 43 of the tuner axis 44 and tightened against the top stop of the slot using a traversal screw 45. This ensures that the blade 42 will not tilt, even if the probe 46 exercises a vertical pulling force when moved vertically. On the side of the probe the same mounting technique is used: the blade is inserted inside a slot 47 of the probe's holding pin 48 and tightened against the bottom of this slot 49 using a traversal screw 50.

This mounting technique allows the probe itself 51 to deviate slightly sidewise 52, 53 in order to follow seamlessly the channel of the slabline (FIG. 3). At the same time the probe body can be moved vertically without tilting. It can also be moved horizontally without any measurable backlash.

If the tuner axis is misaligned (FIG. 9) the steel blade allows the probe to tilt 52, but without losing vertical or horizontal positioning accuracy, since the blade 42 cannot bend vertically, The flexible joint between vertical axis and RF probe works for single probe tuners as well as for multiple probe tuners. In case of a single probe tuner alignment becomes even easier to carry through. A setup for a two probe tuner is shown in FIG. 15. In this case the first probe 54 is kept in place by a non-flexible joint 55, whereas the second probe 56 is mounted using a flexible joint made of a steel blade 57 firmly attached to the tuner axis 58 and the probe holding pin 59. In this case the alignment of the first probe 54 is still critical, whereas the second probe 56 is self-aligning when the carriage holding the axis 60 moves horizontally 56a or the axis 60 moves vertically 60a.

FIG. 17 shows a two probe tuner structure, where both probes 61 and 62 are mounted using flexible steel blade joints 63, 64 to the corresponding vertical axis 65, 66. This tuner configuration is the simplest one to align; in fact it is mostly "self-aligning".

FIG. 18 shows an actual perspective view of a tuner probe mounted using a flexible steel blade joint into a narrow (millimeter wave frequency) channel of a slabline.

FIG. 19 shows a side view of a double probe tuner using a single vertical axis 67 on which two identical probes 68 and 69 are mounted on the vertical tuner axis 67 using a central holding pin 73 and a single two-sided flexible steel blade joint 70. In this case both probes move simultaneously in horizontal and vertical direction, but each one can adjust to the possible imperfections of the slabline channel 71, even when they are very close to the central conductor 72.

In a further configuration (FIG. 20) a tuner with a double-probe carries a flexible steel blade joint 74 which has more than two lateral holes at various distances 75, 76, 77, which allow the two probes 78, 79 to be mounted at adjustable distances from each other 86. This allows changing the operational frequency band of the tuner (FIG. 7) and shifting it at will into an area of interest for the user. This adjustment must be done manually. This is the disadvantage of this type of double probe tuner.

In an alternative configuration (FIG. 21) a double probe tuner is shown, which comprises two different probes, one for high frequencies 80 and one for low frequencies 81, both being mounted on a single flexible steel blade joint 82, which has also extra holes 83, 84 for being able to be used at different frequency bands by changing the horizontal space 85 between probes.

In some cases a static probe adjustment is sufficient. FIG. 22 shows such an arrangement. It comprises an intermediate cylinder 86, 94 between the tuner axis 87 and the probe 88. Said intermediate cylinder has two vertical slots 89, 90, which allow it to rotate 97 inside the tuner axis 87 and is fastened around the probe holding pin 91 using an ordinary collar 92 and fastening screw 93. The important feature of this intermediate cylinder shown as item 86 (in FIGS. 23a) and 94 (in FIG. 23b) is that its central hole is placed eccentrically relative to its outside periphery. This way, by rotating this intermediate cylinder 94 as shown by the arrow 97 an operator can shift the probe 88 laterally, as shown by the arrow 95, and compensate for a misalignment of the tuner axis 87 relative to the slabline 96. This technique, allows for a static compensation for a tuner misalignment, whereas the techniques described in FIGS. 14-21 allow for a dynamic compensation during probe movement inside the slabline.

The scope of the invention as defined in the appended claims is directed, singly or in combination, to a load pull tuner using one, two or more independent or linked probes and two techniques for alignment: a dynamic, self-aligning flexible technique and an operator adjustable static mounting mechanism between the vertical axis of the tuner and the probe(s). The self-aligning technique makes exact adjustment of the probe(s) inside a real slabline, tuner axis and probes manufactured and assembled using realistic tolerances possible during tuner operation and movement, whereas the static adjustment technique allows for compensation mainly of assembly tolerances.

The techniques described here apply in particular to tuners using three probes, such as the multi-probe multi-purpose tuners [6]. In this case it is practically almost impossible to align three RF probes simultaneously inside the same slabline to the required accuracy, because of previous discussed manufacturing misalignments. A self-aligning technique or at least a technique allowing individual lateral adjustment of each RF probe, as described here, are of essence.

Although the present invention has been explained hereinabove by way of a preferred embodiment thereof, it should be pointed out that other combinations of the described compo-

What I claim as my invention is:

1. An electro-mechanical impedance slide-screw tuner comprising a test port and an idle port, a slotted airline (slabline) between those ports, two mobile carriages sliding horizontally along the axis of said slabline, each said carriage comprising a vertical axis, a flexible link and a metallic probe, which can slide into the slot of said slabline; the flexible link is made of a thin steel blade and is attached at its one end to said probe and at its other end to said vertical axis; firm connection between probe, axes and steel blades being preferably ensured by lateral screws; the horizontal and vertical movements of said carriages and associated axes being controlled by lead screws and stepper motors remotely controlled by a computer running appropriate software.

2. An electro-mechanical impedance tuner comprising a test port and an idle port, a slotted airline (slabline) between those ports, a mobile carriage sliding horizontally along the axis of said slabline and comprising a vertical axis, a flexible link and a metallic RF probe, which can slide into the slot of said slabline, said RF probe being attached to said vertical axis by means of said flexible link, which allows self-alignment of said RF probe when said RF probe slides inside said slabline; said link being made of a thin steel blade, which is vertically inserted and firmly attached at one end to the tuner axis and on its other end to said RF probe, firm connections being ensured preferably by lateral screws; the horizontal and vertical movements of said carriage, vertical axis and RF probe being controlled by lead screws and stepper motors and remotely controlled by a computer running appropriate software.

3. An impedance tuner as in claim 2 comprising a double RF probe being made of two individual metallic probes which are attached at the two ends of a flexible link made of a thin steel blade which is attached at the middle to the vertical axis of said tuner; said flexible link allows self-alignment of each individual probe when the double probe assembly slides inside said slabline; firm connections between probes, axis and steel blade being preferably ensured by lateral screws.

4. An impedance tuner as in claim 3 in which said double probe is made of two individual probes which are attached to a flexible link made of a thin steel blade; the first probe is attached to one end of said steel blade whereas the other probe is movable across said steel blade at predefined intervals.

5. An impedance tuner as in claim 2, 3, 4 or 1 comprising an adjustable joint between the vertical axis of each carriage and the probes; said joint comprising an intermediate eccentric metallic ring which, when rotated and fastened at different angles, allows for fine lateral adjustment of the probe inside said slabline.

* * * * *